US007485800B2

(12) United States Patent
Berrada et al.

(10) Patent No.: US 7,485,800 B2
(45) Date of Patent: Feb. 3, 2009

(54) ELECTRICAL CURRENT RETURN DEVICE FOR AVIONIC EQUIPMENT

(75) Inventors: Hicham Berrada, Toulouse (FR); François Montegut, Lameac (FR)

(73) Assignee: Airbus France, Toulouse (FR)

( * ) Notice: Subject to any disclaimer, the term of this patent is extended or adjusted under 35 U.S.C. 154(b) by 0 days.

(21) Appl. No.: 11/061,180

(22) Filed: Feb. 18, 2005

(65) Prior Publication Data

US 2005/0190547 A1 Sep. 1, 2005

(30) Foreign Application Priority Data

Feb. 26, 2004 (FR) .................................. 04 01935

(51) Int. Cl.
*H02G 7/00* (2006.01)
*B64D 45/02* (2006.01)
*H05K 7/04* (2006.01)

(52) U.S. Cl. .......................... 174/5 R; 174/2; 244/1 A; 361/218; 361/807

(58) Field of Classification Search ................. 174/135, 174/2, 94 R, 4, 5 R, 73.1; 244/131, 1 A; 361/218, 223, 807, 808
See application file for complete search history.

(56) References Cited

U.S. PATENT DOCUMENTS 3,989,984 A 11/1976 Amason et al.
4,502,092 A * 2/1985 Bannink et al. ............. 361/218
6,320,118 B1 11/2001 Pridham et al.

FOREIGN PATENT DOCUMENTS

EP 0 976 653 A1 2/2000

* cited by examiner

*Primary Examiner*—Angel R Estrada
(74) *Attorney, Agent, or Firm*—Patterson, Thuente, Skaar & Christensen, P.A.

(57) ABSTRACT

An electrical current return circuit for on-board avionic devices. A conductive metallic bar is attached to a conductive composite structure of an aircraft via insulating fixtures. The conductive metallic bar may be electrically coupled to on-board avionic devices so that a circuit is formed. A number of on-board devices may be connected to the circuit by way of various connector elements. The conductive metallic bar may also form part of a power grid.

10 Claims, 2 Drawing Sheets

ELECTRICAL CURRENT RETURN DEVICE FOR AVIONIC EQUIPMENT

RELATED APPLICATION

The present application claims priority to French Application No. 04 01935 filed Feb. 26, 2004.

TECHNICAL FIELD

This invention concerns the electric feedback of on-board avionic equipment for airplanes, and located, in particular, on composite structures that conduct electricity.

BACKGROUND ART

Power is traditionally supplied to avionic equipment via a power cable at a non-null electrical potential and by return through the structure of the airplane by means of a metallic fixture to which the equipment is attached, at the null or grounding potential of the airplane.

The use of composite conductive structures is becoming more and more important in aircraft, with some such structures replacing metallic structures.

In the case of composite conductive structures, e.g. structures containing carbon and/or laminated aluminum/composite, the materials that, although they are conductive, do not exhibit the conductivity properties required in order to guarantee a sufficient return, and which may be sufficiently resistant to cause a consistent drop in voltage along the length of the current, overheating of the structure, or a fire hazard.

These structures, which do not constitute primary electrical structures, should not be used for current returns; the current return must be insulated from the conductive composite structure.

An additional problem is the fact that, if one chooses to manufacture a cable-based current return, it is necessary to configure the dimensions of the cable based on the distance to be traversed and the number of avionic devices connected, if the return cable is jointly used by more than one avionics, to provide several cables if a separate return is provided for, which complicates the design of electrical systems, increases the weight and cost of the system, and can be detrimental to the reliability of the system due to the complication of the power grid.

SUMMARY OF THE INVENTION

This invention seeks to remedy the conductivity loss of the conductive composite structure while maintaining a simple and reliable current return circuit, by means of an electrical current return device for on board avionics placed on a conductive composite structure of an aircraft, which current return device contains at least one conductive metallic bar affixed to the conductive composite structure via insulating fixtures, which metallic bar contains at least one electrical connection for at least one of said on-board avionics, as well as an electrical connection to a primary electrical structure of said aircraft.

Thus, the conductive metallic bar constitutes a primary structural conductive element.

According to the invention, the electrical connection can comprise an electrical connection fixture for a current return connection of at least one on-board avionics.

The connection fixture may include at least one fixed connector receiving a battery terminal to said connection.

In an advantageous embodiment, the device contains several connection points distributed longitudinally throughout the conductive metallic bar so as to connect several on-board avionics located at a distance from one another.

More specifically, said electrical connection element affixes the metallic bar to said primary electric structure.

Said fixture can, in particular, consist of at least one screw made of highly electrically conductive material.

According to an advantageous embodiment of the invention, the insulating fixtures include screws affixed in the conductive composite structure via insulating conductor joints.

According to the device according to the invention, the conductive metallic bar can be part of a power grid connected along at least one wall of an internal space of the aircraft.

In a particularly advantageous embodiment of the invention, an insulating support can be placed between the conductive metallic bar and the conductive composite structure.

Other characteristics and advantages of the invention will be better understood based on the description below of a non restrictive exemplary embodiment referring to the drawings.

DETAILED DESCRIPTION OF THE DRAWINGS

Figure 1:
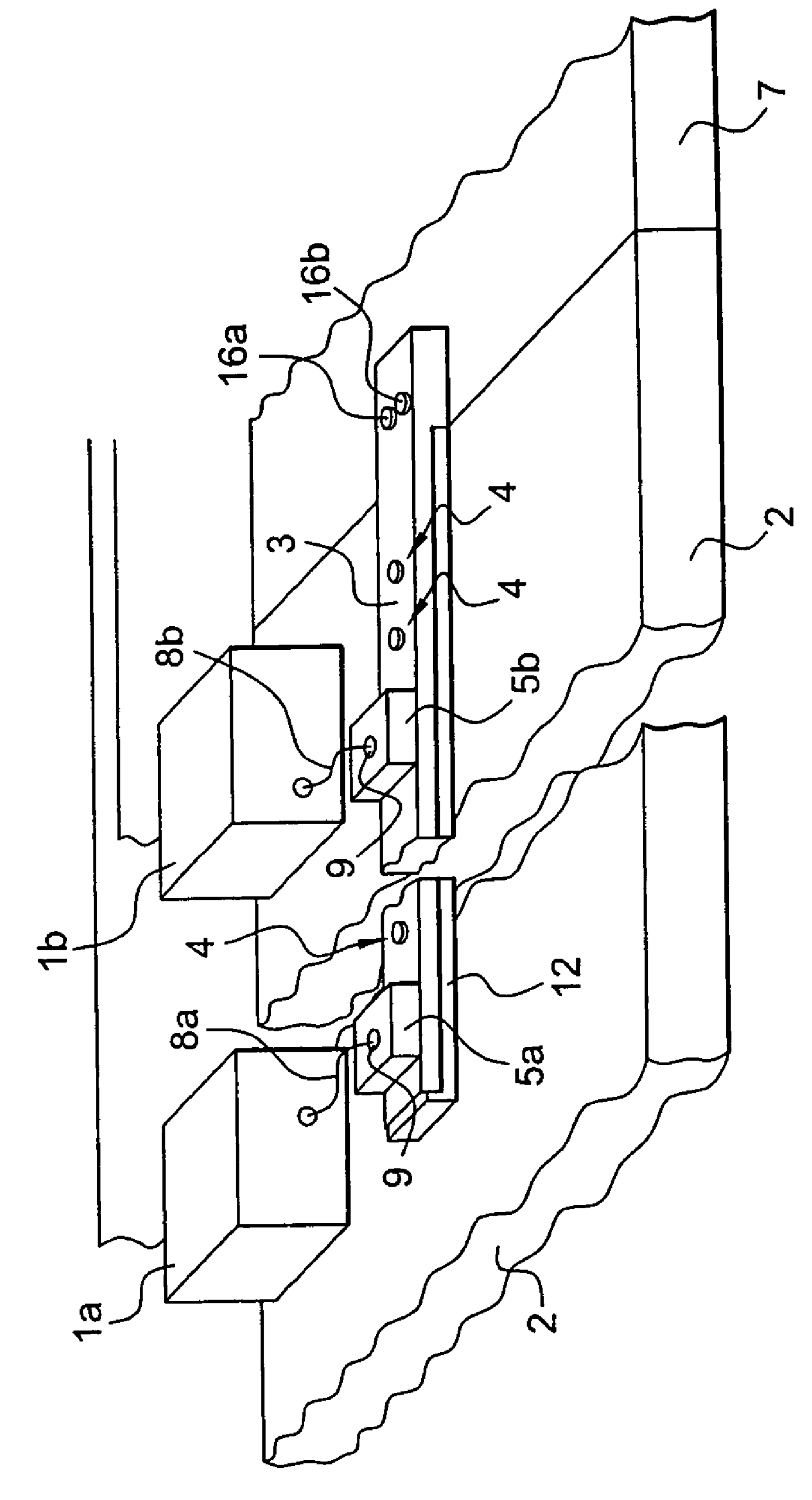
FIG. 1: a perspective view of sections of a device according to the invention.

FIG. 1 shows a schematic of the electrical current return device according to the invention.

This device is applied to on-board avionics 1*a*, 1*b*, which are placed on a conductive composite structure 2 of one part of an aircraft, such as a container or a tank.

The conductive composite structures used frequently contain carbon particles or are made of laminated material, including aluminum layers.

These structures have a certain conductivity, but it does not permit the passage of stronger currents or guarantee the equipotentiality of the structure. Thus, such a conductive composite structure should not be used as a current return, because it is not an adequate grounding in order to serve as a current return circuit.

The invention solves the problem of the risks caused by this lack of conductivity on the part of the structure, in particular, by creating an electrical current return device that is insulated from this structure.

The device contains at least one conductive metallic bar 3. This bar, affixed to the conductive composite structure via insulating fixtures 4, carries off the return current of avionics 1*a*, 1*b* up to a metallic structure 7, which is adapted to the passage of strong currents and constituting a grounding or null reference electrical potential, one such metallic structure being referred to as the primary electrical structure of the aircraft.

The bar 3 is connected to this primary electrical structure 7 by an electrical connecting element 6, which, according to the example shown, is also a mechanical fixture 16, 16*a*, 16*b* of the metallic bar 3 on the primary electrical structure 7, e.g. a screw made of a highly electrically conductive material.

Figure 2:
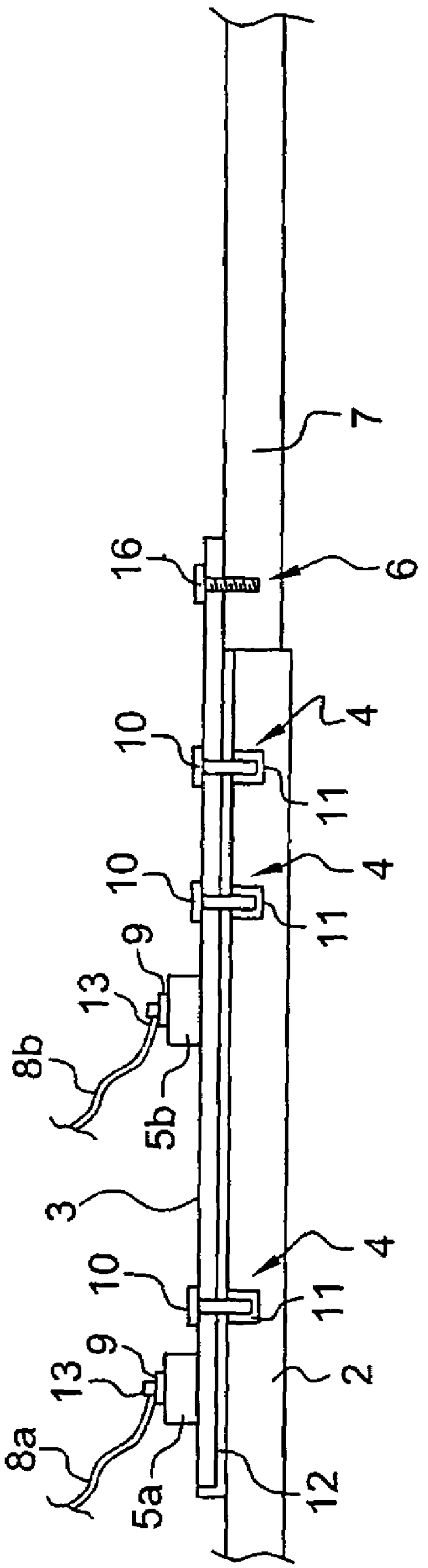
FIG. 2: a lateral cross-section of the device shown in FIG. 1.

The bar 3 is then positioned on an insulating support 12 and affixed to the conductive composite structure 2 by insulating fixtures made according to the example shown in FIG. 2 by screws 10 affixed on the conducting composite structure via insulating conductor joints 11 or by any sort of fixture (e.g. insulants such as fixation clips).

The bar can be straight, curved, or irregular in order to ensure proximity to on-board avionics 1*a*, 1*b*, to which it must be connected.

In order to connect said on-board avionics 1*a*, 1*b*, the bar contains at least one electrical connection 5*a*, 5*b* for at least one on-board avionics 1*a*, 1*b*. Depending on the position of the on-board avionics on the support, several avionics maybe connected to one electrical connection, or, as shown in FIGS. 1 and 2, one connection 9 made of a connection fixture for a current return electrical connection cable 8*a*, 8*b*, by an on-board avionics can be provided for.

The connection fixture according to the example includes a fixed connector 9 receiving a battery terminal 13 to connect electrical connection cable 8*a*, 8*b* of the on-board avionics.

Thus, the bar may, depending on its length and the number of on-board avionics that must be electrically connected, include several electrical connections 5*a*, 5*b*, distributed throughout the length of the conductive metallic bar 3, so as to connect several on-board avionics 1*a*, 1*b* located at a distance from one another.

Moreover, the invention allows for the creation of a power grid for current return along at least one wall of an interior space of the aircraft, several conductive metallic bars 3, comprising the power grid.

The device according to the invention can, for example, be created based on bars with a predetermined dimension, containing separable parts in order to obtain bars with lengths that can be adjusted based on the distance from the avionics to the primary electrical structures of the aircraft.

The grid can, for example, be placed around an interior space of a housing, such as a tank or a container comprised of panels 2 made of conductive composite material, while remaining electrically insulated from the panels that comprise this interior space by means of insulating fixtures 4 and the insulating support 12 between bars 3 of the grid and the panels.

The device according to the invention thus allows for a convenient manner of creating a primary electrical substructure in containers in an aircraft.

The invention claimed is:

1. An electrical device for providing a current return circuit to the primary electrical structure of an aircraft from avionics mounted on portions of the aircraft formed from composite structure, comprising:

a structural conductive element comprising at least one conductive metallic bar;

insulating fixtures received by the at least one conductive metallic bar and the composite structure affixing the at least one conductive metallic bar to the composite structure in electrically insulating relationship;

an insulating support interposed between the at least one conductive metallic bar and the composite structure;

an electrical connecting element comprising a conductive fixture received by the at least one conductive metallic bar and the primary electrical structure of the aircraft affixing the at least one conductive metallic bar to the primary electrical structure;

an electrical connection comprising a current return electrical terminal carried by said at least one conductive metallic bar, the current return electrical terminal providing a current return connection for said avionics mounted on said composite structure, whereby said current return circuit provides a power grid insulated from said composite structure for electrically connecting said avionics to said aircraft primary electrical structure.

2. The electrical device according to claim 1, wherein said electrical connection comprises a connection fixture for a current return connection cable of avionics.

3. The electrical device according to claim 2, wherein said electrical connection includes at least one connector receiving a battery terminal connected to said electrical connection.

4. The electrical device according to claim 1, including several electrical connections distributed longitudinally throughout the at least one conductive metallic bar in order to connect several avionics that are located distant from one another.

5. The electrical device according to claim 1, wherein said conductive fixture received by the conductive metallic bar and the primary electrical structure of the aircraft comprises at least one screw made of highly electrically conductive material.

6. The electrical device according to claim 1, wherein the insulating fixtures comprise screws that are affixed to the composite structure via conductor joints.

7. The electrical device according to claim 1, wherein said at least one metallic bar is part of a power grid positioned along at least one wall made of composite structure of an interior space of the aircraft.

8. The electrical device according to claim 1, wherein said at least one metallic bar is adapted for passage of strong currents, constituting a grounding or null reference electrical potential.

9. The electrical device according to claim 1, wherein said at least one metallic bar is a straight, curved, or irregular shape to ensure proximity to the avionics.

10. The electrical device according to claim 1, wherein the composite structures comprises a container or a tank.

* * * * *